US005859795A

United States Patent [19]
Rolandi

[11] Patent Number: 5,859,795
[45] Date of Patent: Jan. 12, 1999

[54] MULTI-LEVEL MEMORY CIRCUITS AND CORRESPONDING READING AND WRITING METHODS

[75] Inventor: Paolo Rolandi, Voghera, Italy

[73] Assignee: SGS-Thomson Microelectronics S.r.l., Agrate Brianza, Italy

[21] Appl. No.: 791,348

[22] Filed: Jan. 30, 1997

[30] Foreign Application Priority Data

Jan. 31, 1996 [EP] European Pat. Off. .............. 96830044

[51] Int. Cl.⁶ ...................................... G11C 7/00
[52] U.S. Cl. ..................... 365/168; 365/189.02
[58] Field of Search ............... 365/168, 189.01, 365/189.03, 189.02, 230.02

[56] References Cited

U.S. PATENT DOCUMENTS

| | | | |
|---|---|---|---|
| 5,218,569 | 6/1993 | Banks | 365/189.01 |
| 5,671,388 | 9/1997 | Hasbun | 365/168 X |

FOREIGN PATENT DOCUMENTS

| | | |
|---|---|---|
| 0 496 288 A3 | 7/1992 | European Pat. Off. . |
| 56-153582 | 11/1981 | Japan . |
| WO 90/12400 | 10/1990 | WIPO . |

OTHER PUBLICATIONS

Takahiro Hanyu et al., *Systems and Computers in Japan*, vol. 21, Nov. 12, 1989, "Design of a Multiple–Valued Associative Memory", pp. 23–32.

*Primary Examiner*—Do Hyun Yoo
*Attorney, Agent, or Firm*—Allen, Dyer, Doppelt, Milbrath & Gilchrist, P.A.

[57] ABSTRACT

The present invention relates to a memory circuit of the multi-level type, i.e. a memory circuit having a plurality of memory elements, each adapted to store more than one binary information unit, wherein the memory elements are utilized for storing a number of binary information units tied to an acceptable error rate for a particular application: typically, one bit where a low error rate is sought, and two bits where a higher error rate can be accepted.

19 Claims, 6 Drawing Sheets

FIG. 17

MULTI-LEVEL MEMORY CIRCUITS AND CORRESPONDING READING AND WRITING METHODS

FIELD OF THE INVENTION

This invention relates to a memory circuit of the multi-level type, i.e., a memory circuit comprising memory elements, each capable of storing a multiplicity of binary information units.

BACKGROUND OF THE INVENTION

Considerable interest is presently attached to multi-level memories due to a demand for ever larger capacity of the storage devices. In a recent article, "A Multilevel-Cell 32 Mb Flash Memory", ISSCC95. Session 7, Paper TA 7.7, February 1995, a FLASH storage device of the multi-level type is concisely presented which can store two binary information units, or bits, per memory element, or cell. In particular, the following items are illustrated therein: the distribution of the cell threshold voltage for levels corresponding to the four possible states/values of the two bits in FIG. 1, the reading circuit diagram in FIG. 2, and the architecture of the writing circuit in FIG. 4 of the article.

It can be appreciated, from the distribution presented therein, that both the writing/reading processes and the physical structure of the cell are quite critical, much more so than with two-level memories, especially when the supply voltage is decreased to, e.g., 3.3 volts. The criticality becomes still greater as the number of the levels is raised to more than four. The outcome of this criticality is an increased error rate.

A like increase in criticality is also to be expected when the electrical parameter, whereby the cell storage state is discriminated, instead of being the threshold voltage of a floating gate MOS transistor, is a charge stored in a capacitor, as is the case with DRAM memories. This is so because it would then be necessary to compare the value of an electrical parameter with a multiplicity of reference values lying in close proximity to one another.

A known expedient in the field of two-level memories for lowering the error rate is that of using error detecting and/or correcting words, and having them stored additionally to the information words. This results in a not negligible portion of the die area being "wasted" to that object.

SUMMARY OF THE INVENTION

It is an object of this invention to provide a memory circuit of the multi-level type which can accommodate that criticality without involving any significant waste of area.

This and other objects, features, and advantages of the present invention are provided by a memory circuit comprising a plurality of memory elements, each capable of storing a multiplicity of binary information units. The plurality of memory elements have at least first and second modes of operation, with the memory elements being utilized in the first mode of operation as if adapted for storing each a first number of binary information units. The memory elements being utilized in the second mode of operation as if adapted for storing each a second number of binary information units, and wherein the first and second numbers are dissimilar.

In one embodiment, the plurality of memory elements may be divided into at least a first and a second set, with the memory elements in the first set being utilized as if adapted for storing each a first number of binary information units, and the memory elements in the second set being utilized as if adapted for storing each a second number of binary information units. Again, the first and second numbers are dissimilar.

The idea that underlies the present invention consists of utilizing the memory elements to store a number of binary information units which is tied to an acceptable error rate for a particular application: typically, one bit where a low error rate is sought, and two bits where a higher error rate can be accepted.

BRIEF DESCRIPTION OF THE DRAWINGS

The invention can be more clearly understood from the following detailed description, to be taken in conjunction with the accompanying drawings, in which.

DETAILED DESCRIPTION OF PREFERRED EMBODIMENTS

As previously mentioned, despite the continual evolution undergone by electronics and semiconductor technologies, there is bound to remain a difference in criticality, and hence error rate, between memories used for storing different numbers of information units per cell. Thus, the idea underlying this invention is utilizing the memory elements for storing a number of binary information units according to an acceptable error rate for a particular application. The acceptable error rate may either be tied to the type of information (e.g., highly important data, comparatively unimportant data, programs, etc.), or the type of application (e.g., PC computer applications, telephone exchange control applications), and may depend on time. In fact, a given storage device within a given electronic system may have to be used for different applications in different situations.

This idea can be implemented in a memory circuit in at least two different ways. In a first way, the memory circuit, comprising a plurality of memory elements, each adapted to store more than one binary information unit, can be operated in at least a first and a second mode. In the first mode, the memory elements are used as if adapted each to store a first number of binary information units, and in the second mode, the memory elements are used as if adapted each to store a second number of binary information units and wherein the second and first numbers are dissimilar.

In general, this circuit could be provided for plural modes of operation, with each mode corresponding to a different number of binary information units. In the second way, the memory circuit, comprising a plurality of memory elements divided into at least a first and a second set, is arranged such that the memory elements in the first set are used as if adapted each to store a first number of binary information units, and the memory elements in the second set are used as if adapted each to store a second number of binary information units. Here again, the second and first numbers are dissimilar. This second circuit embodiment, while seemingly different to the first, can be regarded as having a first and a second mode of operation which become active upon accessing the memory elements of the first set and the second set, respectively.

In general, the plurality of memory elements in this circuit may be divided into plural sets, with each set corresponding to a different number of binary information units. Such sets may also be referred to as "blocks" or "sectors", in conformity to a terminology which is commonplace in the field of semiconductor memories, in particular of FLASH memories.

Figure 1:
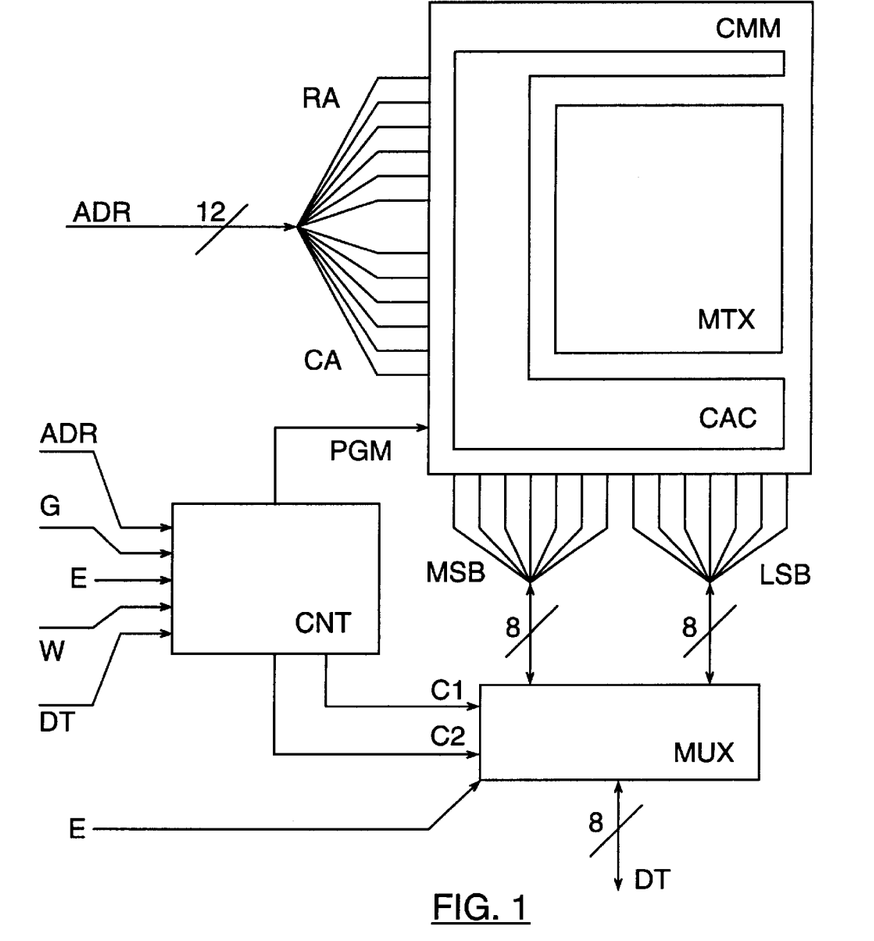
FIG. 1 is a block diagram of a memory circuit according to the invention.

Both embodiments of the memory circuit can be implemented in accordance with the block diagram of FIG. 1. This diagram includes a conventional multi-level memory circuitry CMM which is divided into a matrix MTX of memory cells or elements, each adapted to store a given number, greater than one, of binary information units, and an access circuit CAC for accessing the cells in the multi-level mode for reading and/or writing and/or erasing, etc.

The circuitry CMM has row address inputs RA, e.g. 6 such inputs; column address inputs CA, e.g. 6 such inputs; input/output terminals MSB, e.g. 8 such terminals, for the most significant data; input/output terminals LSB, e.g. 8 such terminals, for the least significant data; and a write control input PGM. Taken together, the inputs RA and CA form address inputs ADR, 12 such inputs in this example, of the memory circuit according to this invention. The matrix MTX is composed, for example, of 32768 memory cells, all identical and each capable of storing in a relatively reliable manner a binary value consisting of, for example, two binary information units, associating that value with the state of an electrical parameter thereof in conformity to a predetermined rule. Irrespective of the association rule selected, one of the two bits will be stored in a more reliable manner than the other, so that it seems reasonable to refer to that one bit as the most significant bit, and to the other as the least significant bit. In the example, when an address formed of 12 bits is presented to the inputs ADR, the circuit CAC will select eight memory cells from those in the matrix MTX. The most significant bits of each of these cells are respectively associated with the terminals MSB, and the least significant bits of these cells are respectively associated with the terminals LSB.

U.S. Pat. No. 5,218,569 discloses the circuitry CMM of this type which is adapted for use in the memory circuit of this invention, for example. A block diagram thereof is given in FIG. 5 of that patent. For the purpose of this specification, the contents of U.S. Pat. No. 5,218,569, issued on Jun. 8, 1993 and providing an exhaustive description of multi-level memory circuitry of the electrically programmable non-volatile type—EEPROM or FLASH—from both the constructional and functional standpoints, is incorporated herein by reference. As an alternative, the circuitry CMM may be of some other types—ROM, EPROM, DRAM, CCD, etc.—and may be embodied in different ways. Some possible embodiments can be derived from the patents enumerated as prior art in the above U.S. patent.

The arrangement of FIG. 1 further comprises a control unit CNT and a multiplexer MUX. The multiplexer MUX is connected with one end to he terminals MSB and LSB of circuitry CMM, and with the other end to data input/output terminals DT of the memory circuit according to this invention. The multiplexer MUX has two select control inputs C1 and C2, and an enable control input CE connected to a circuit enable input E of the memory circuit according to this invention.

The unit CNT is connected with its output to the write control input PGM of circuitry CMM, and to the select control inputs C1 and C2 of the multiplexer MUX for delivering internal control signals. Furthermore, the unit CNT is usually connected with its input to the address inputs ADR, the data terminals DT, a circuit enable input E, a write enable input W, and a read enable input G; the inputs E, W, G jointly forming control inputs for the memory circuit of this invention. Depending on the construction of the unit CNT, its internal mode of operation, and the functionalities it can provide, some of the above mentioned connections may be unnecessary, especially as regards the inputs.

The choice of whether to embody the first circuit design or the second circuit design, using the arrangement shown in block diagram form in FIG. 1, will depend on the construction of the unit CNT. Whether the first or the second design is selected, the choice of the first and the second number of binary information units must be made. At the present state of the art, the most reasonable choice has the first number equal to one (two-level mode of operation) and the second number equal to two (four-level mode of operation); this is the choice adopted in the examples herein below. The continual evolution of the art makes the use of larger numbers a likely proposition in the future. Extremely high versatility can be provided by arranging for the unit CNT to set such first and/or second numbers in conformity to setting instructions sent to it.

While the circuit of FIG. 1 includes a matrix MTX of cells, this is no more of a requirement than an advantage. In fact, if all the memory elements in the aforesaid plurality are substantially identical and arranged into a matrix, they can be accessed by the same access circuit, as referenced CAC in FIG. 1, regardless of the number of binary information units actually stored or being stored into each. This enhances the circuit versatility.

In the respect of at least the reading and writing operations, these can advantageously be carried out internally, independently of the number of binary information units actually stored and being stored respectively into each memory element, if an appropriate selection is applied to the information units, e.g. through the multiplexer MUX. This enhances still further the circuit versatility and simplicity.

Figure 12:
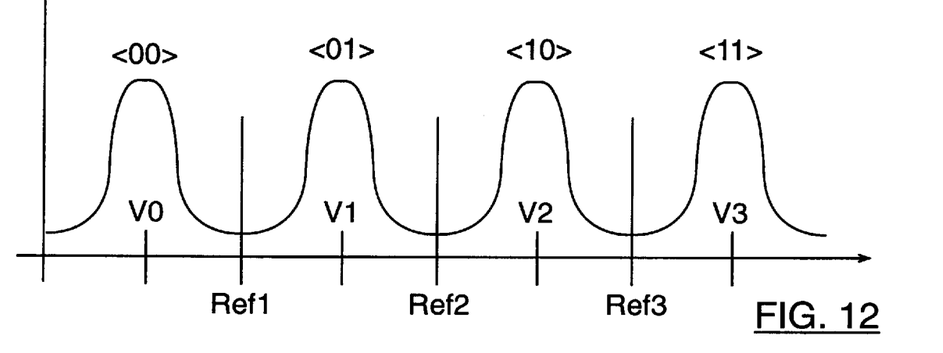
FIG. 12 shows the overall threshold voltage distribution of the cell in the four-level mode.

Assuming that memory cells of the FLASH type are available which can store in a relatively reliable manner no more than two bits: for writing, a cell threshold voltage value V0 can be associated with data "00", a value V1 greater than V0 with data "01", a value V2 greater than V1 with data "10", and a value V3 greater than V2 with data "11"; for reading, if the detected value of the cell threshold voltage lies between 0 and Ref1, this can be associated data "00", data "01" if between Ref1 and Ref2, data "10" if between Ref2 and Ref3, and data "11" if greater than Ref3. This is illustrated in FIG. 12 and designated the four-level mode of operation. It can be seen in this figure that the distribution value is not nil at the references Ref1, Ref2, Ref3, which indicates an error rate, that is a likelihood of adjacent data getting mixed up (in terms of values of the corresponding threshold voltages).

Figure 13:
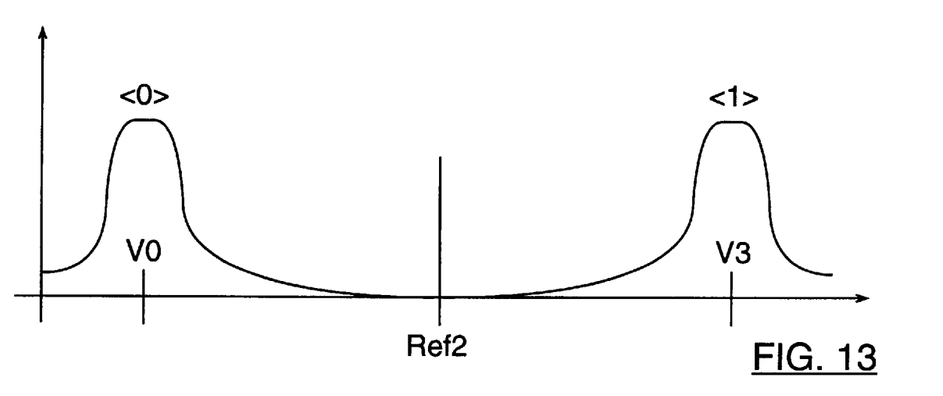
FIG. 13 shows the overall threshold voltage distribution of the cell in the two-level mode.

On the other hand, if it is chosen of storing into the cells data comprised of one bit only, the error rate can be brought down, provided that values of the threshold voltages associated with the data are selected suitably apart from one another. For writing, data "0" may be associated the value V0, and data "1" may be associated the value V3. For reading, if the detected value of the cell threshold voltage is a lower one than Ref2, data "0" can be associated therewith; data "1", if higher than Ref2. This is illustrated in FIG. 13, and designated the two-level operation mode. It can be seen in that figure that the distribution value is substantially nil at the reference Ref2, so that the error rate is quite low.

Figure 14:
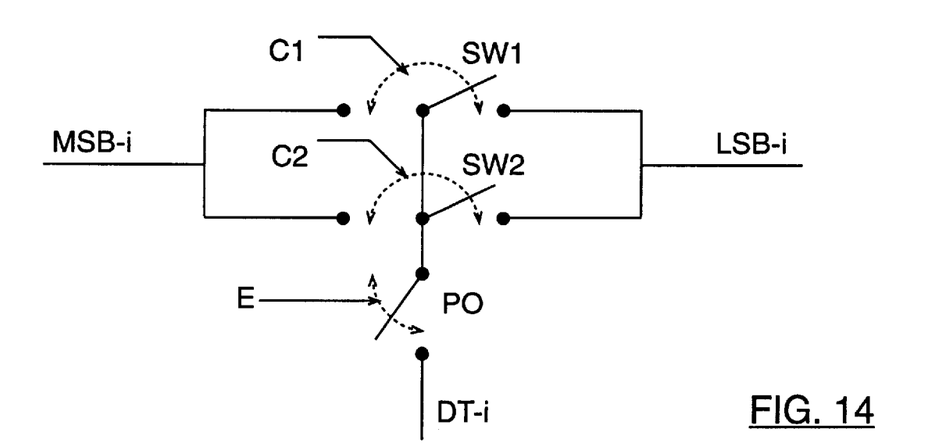
FIG. 14 shows a possible circuit diagram for one of several modules of the multiplexer included in the diagram of FIG. 1.

In practice, when the same writing and reading circuits are utilized for both the two-level and four-level modes, a one-bit data can be written in the two-level mode by writing, in the four-level mode, a two-bit data obtained by duplicating the one-bit data. Data read in the two-level mode is obtained from data read in the four-level mode by selecting the most significant bit, i.e. the first bit. This functionality can be provided by the multiplexer MUX as suitably controlled through its inputs C1 and C2 and suitably connected to the terminals MSB and LSB. FIG. 14 shows in detail one of the eight modules which make up the multiplexer MUX, there being one module for each of the terminals DT.

A generic module "i" is connected to a terminal DT-i, one of the terminals DT, on the one side, and to terminals MSB-i, one of the terminals MSB, and LSB-i, one of the terminals LSB, on the other. It includes an on/off switch PO having a break control terminal connected to the terminal E, a first conduction terminal connected to the terminal DT-i and a second conduction terminal, a first switch SW1 having a switch control terminal connected to the terminal C1, a common conduction terminal connected to the second terminal of the switch PO, a first conduction terminal connected to the terminal MSB-i, and a second conduction terminal connected to the terminal LSB-i, and a second switch SW2 having a switch control terminal connected to the terminal C2, a common conduction terminal connected to the second terminal of the switch PO, a first conduction terminal connected to the terminal MSB-i, and a second conduction terminal connected to the terminal LSB-i. In the schematics of FIG. 14, the on/off switch PO and switches SW1 and SW2 are switching circuit elements of the two-way type for the signal to be switched.

As an alternative, in the four-level mode, data "00" may be associated the value V3, data "01" the value V2, data "10" the value V1, data "11" the value "V0", and in the two-level mode, data "0" may be associated the value V3, and data "1" the value V0.

Figure 4:
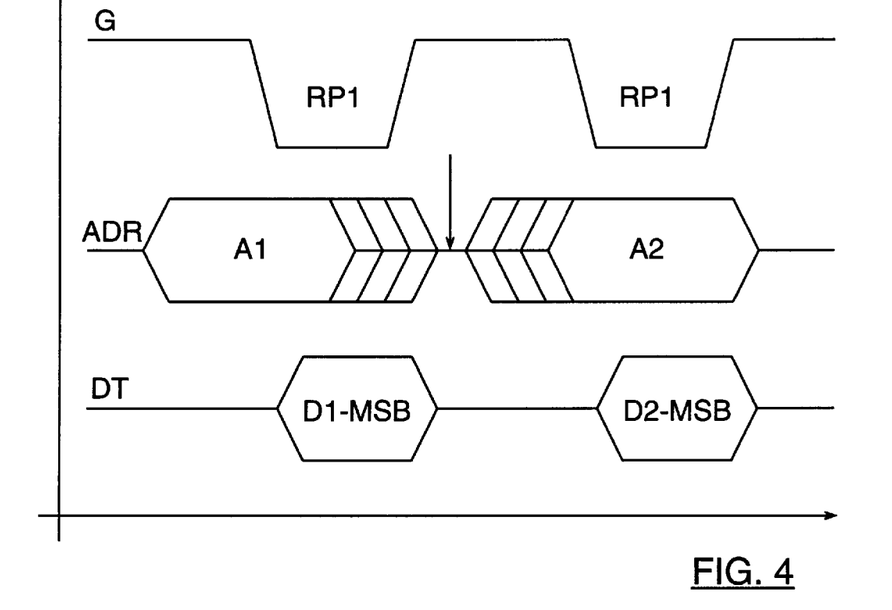
FIGS. 4, 5, 6 and 7 are plots versus time of certain electric signals at the terminals of the circuit in FIG. 1, respectively during a reading operation in the two-level mode, a reading operation in the four-level mode, a writing operation in the two-level mode, and a writing operation in the four-level mode.
Figure 5:
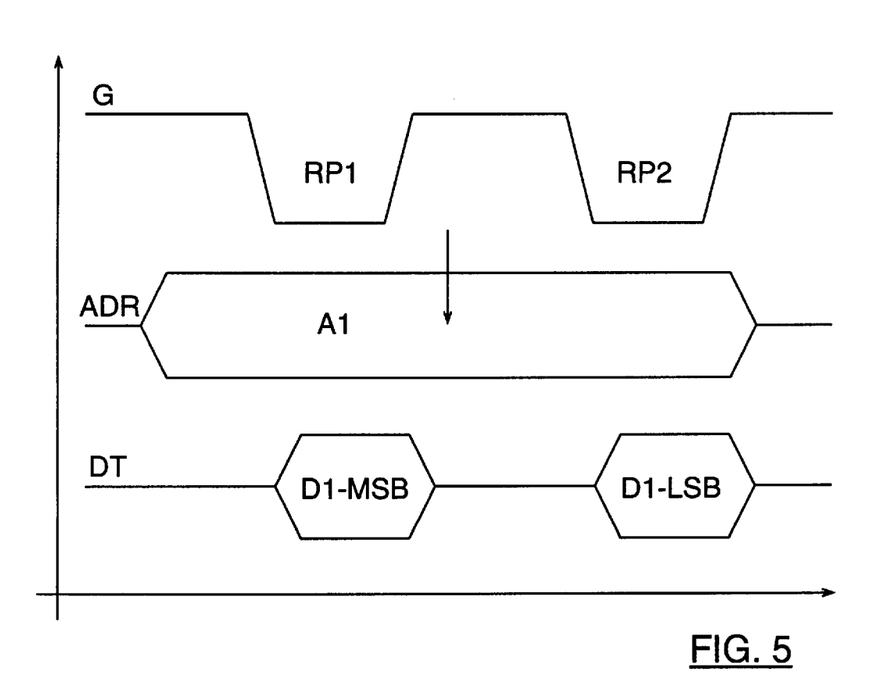

Referring to FIGS. 1, 4 and 5, a method of reading information from a memory circuit MEM, according to the invention, comprising a plurality, e.g. 32768, of memory elements, each adapted to store more than one, e.g. two, binary information units and set up for access in sets, each formed of a number, e.g. eight, of elements, being provided with a data output, such as the data input/output terminals DT, consisting of a number of lines (e.g. eight) equal to the number of the elements, and provided with an address input ADR consisting of a number of lines (e.g. twelve) equal to the logarithm to the base two of the ratio of the multiplicity of the plurality to the multiplicity of sets, comprises the steps of:

a) sending a read address A1 to the circuit MEM through the address input ADR;

b) selecting memory elements from a corresponding set to the read address A1;

c) consecutively sending, to the circuit MEM, a number such as 1 or 2 of read pulses RP1 or RP1 and RP2, respectively, equal to the number, such as 1 or 2, of the binary information units stored in each of the selected elements; and d) consecutively reading, from the circuit MEM through the output DT, data corresponding to the binary information contained in the selected elements, respectively at each of said read pulses.

Referring to FIGS. 4 and 5, the read data is for one information unit, D1-MSB, and for two information units, D1-MSB and D1-LSB. In FIG. 4, upon a following read pulse, as also denoted by RP1, and another address A2 being received, another da a D2-MSB will be read. What takes place within the memory circuit of FIG. 1 is first an "internal" reading in the four-level mode by the circuitry CMM, then the presentation of the read 16-bit data such as D1, and finally a selection by the multiplexer MUX under control by the unit CNT of the most significant 8-bit portion D1-MSB presented at the terminals MSB, or the least significant 8-bit portion D1-LSB presented at the terminals LSB.

Figure 6:
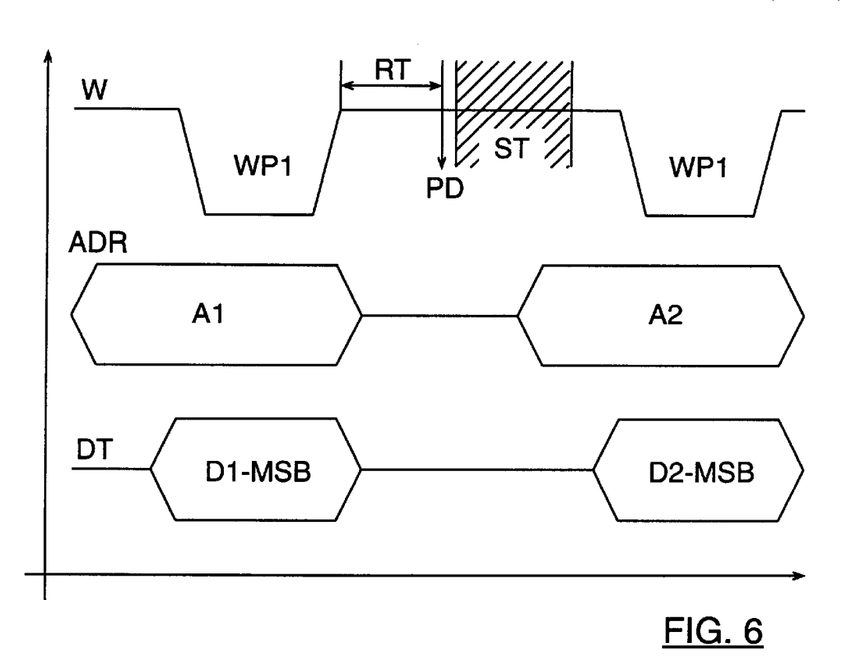
Figure 7:
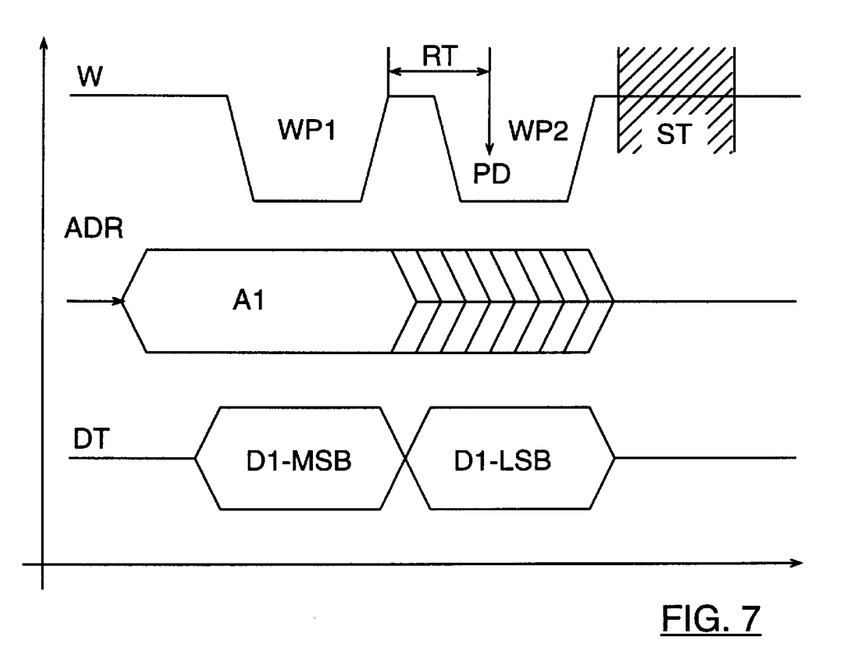

Referring to FIGS. 1, 6 and 7, a method of writing information into a memory circuit MEM according to the invention, such as that described in the preceding paragraph, wherein a data input is provided such as the data input/output terminals DT, comprises the steps of:

a) sending a write address A1 to the circuit MEM through the address input ADR;

b) selecting memory elements from a corresponding set to the write address A1;

c) consecutively sending, to the circuit MEM, a number such as 1 or 2 of write pulses WP1 or WP1 and WP2, respectively, equal to the number, such as 1 or 2, of the binary information units to be stored into each of the selected elements;

d) consecutively sending, to the circuit MEM through the input DT, data corresponding to the binary information to be stored, respectively at each of said write pulses; and e) storing the binary information into the selected elements.

Referring to FIGS. 6 and 7, the data to be stored is for one information unit, D1-MSB, and for two information units, D1-MSB and D1-LSB. In FIG. 6, upon receiving a following write pulse, also denoted by WP1, and another address A2, arrangement is made for storing another data, denoted by D2-MSB. What takes place within the memory circuit of FIG. 1 is first a preparation of the 16-bit data, such as D1, to be stored and then, upon enabling the input PGM, an "internal" reading in the four-level mode by the circuitry CMM. The first 8-bit data received at the inputs DT is presented by the multiplexer MUX under control by the unit CNT to both the terminal MSB and the terminals LSB, and is stored temporarily by means of the circuitry CMM. If the two-level mode has been selected, the data preparation ends here, but if the four-level mode has been selected, the second 8-bit data received at the inputs DT is only presented to the terminals LSB, and stored temporarily by the circuitry CMM as the least significant portion of the data D1.

These read and write methods have major advantage in that they are compatible with conventional methods. In fact, if during the respective step c) a single pulse is issued, as is the case with conventional memory circuits, the operation will be carried out in a conventional manner; that is, the circuit of this invention can be replaced terminal-by-terminal with a conventional circuit without modification of the circuits around it.

Having thus explained how one bit (two-level mode) or two bits (four-level mode) can advantageously be stored, written and read into/from the same cell, a description will now be given of how the unit CNT can be made to alternatively enable the two-level or the four-level mode. A first possibility is to select the mode in relation to electric control signals to the control inputs of the memory circuit according to the invention, preliminarily to reading or writing operations. These electric signals will indicate the number of read RP or write WP pulses to follow. This can be obtained, for example, by arranging for a suitable control input to be active at least shortly before an operation whichever and thereby determine the mode, e.g. the four-level mode, of its execution within the circuit. Alternatively, this can be achieved by selecting, for different modes, different enable timings of the same control inputs, as shown in FIGS. 8, 9, 10 and 11.

Figure 8:
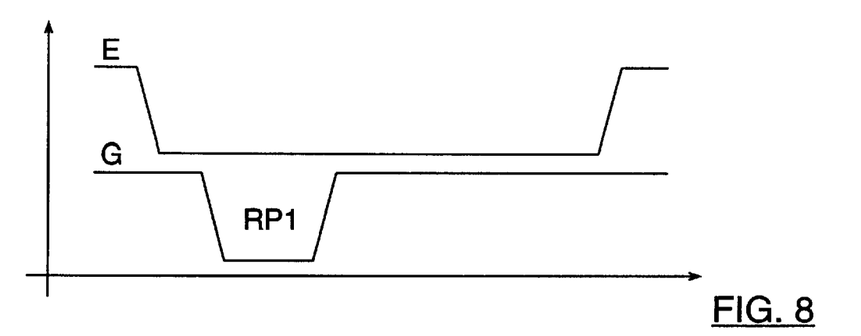
FIGS. 8, 9, 10 and 11 are further possible plots versus time of certain electric signals at the terminals of the circuit in FIG. 1, respectively during a reading operation in the two-level mode, a reading operation in the four-level mode, a writing operation in the two-level mode, and a writing operation in the four-level mode.
Figure 9:
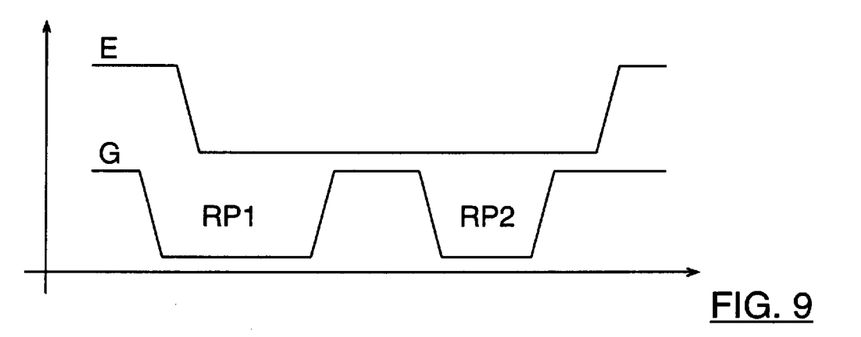
Figure 10:
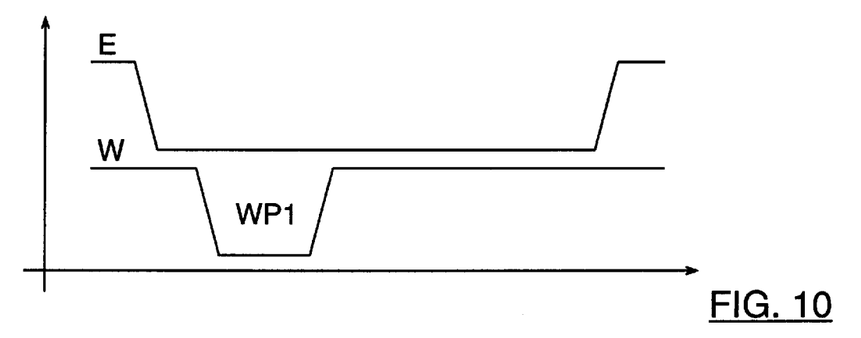
Figure 11:
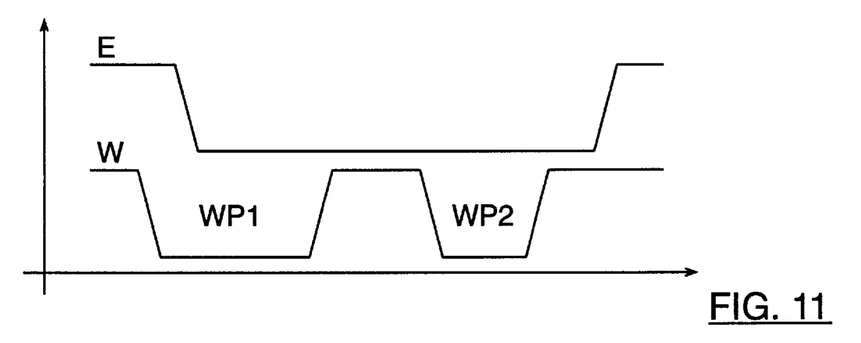

In FIG. 8, the signal at the circuit enable input E is enabled, to the low logic state, before the arrival of a read pulse RP1 at the read enable input G; the circuit MEM will recognize this timing as the two-level read mode having been selected, In FIG. 9, the signal at the input E is enabled after the arrival of the pulse RP1; the circuit MEM will recognize this timing as the four-level read mode having been selected, and preset itself for receiving a second read pulse RP2. In FIG. 10, the signal at the circuit enable input E is enabled, to the low logic state, before the arrival of a write pulse WP1 at the write enable input W; the circuit MEM will recognize this timing as the two-level write mode having been selected. In FIG. 11, the signal at the input E is enabled after the arrival of the pulse WP1; the circuit MEM will recognize this timing as the four-level write mode having been selected and preset itself for receiving a second write pulse WP2.

Figure 15:
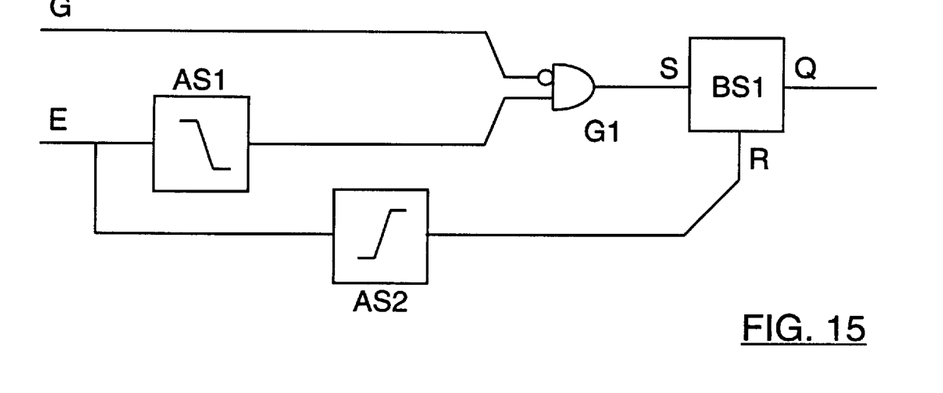
FIGS. 15, 16 and 17 respectively show first, second and third possible circuit diagrams for a four-level mode detector to be used in the control unit included in the diagram of FIG. 1.

Shown in FIG. 15 is a diagram of a first circuit capable of outputting a high active logic signal indicating the four-level read mode, based on the electric signals depicted in FIGS. 8 and 9. This circuit comprises a monostable AS1 responsive to trailing edges and having an input connected to the input E, a monostable AS2 responsive to leading edges and having an input connected to the input E, a logic gate G1 of the AND type having a normal input connected to the output of the monostable AS1 and a negated input connected to the input G, and a bistable BS1 having a set input S connected to the gate G1 output, a reset input R connected to the output of the monostable AS2 and having a state output Q connected to the circuit output.

A second possibility is to select the modes in relation to at least control signals to the control inputs of the memory circuit of this invention, concurrently with reading or writing operations. This can be obtained, for example, by selecting, for different modes, different timings of the same control inputs during such operations, as shown in FIGS. 6 and 7.

In FIG. 6, the two pulses WP1 at the input W are timed far apart, and specifically, the second pulse WP1 occurs after the time PD, which carries a predetermined constant delay from the leading edge of the first pulse WP1; the circuit MEM will recognize this timing as the two-level write mode having been selected. In FIG. 7, the pulses WP1 and WP2 are timed close together, and specifically the pulse WP2 starts ahead of the time PD; the circuit MEM will recognize this timing as the four-level writ mode having been selected.

In either case, the circuit MEM shall have to wait for a time interval having the same duration as the predetermined delay RT, after the end of a write pulse, i.e. after the leading edge. If no other pulse is started before the end of this interval, is shown in FIG. 6, the actual storage step commences, interval ST. If, on the contrary, another pulse WP2 is started, as shown in FIG. 7, a second data D1-LSB is acquired, and directly after the end of the pulse WP2, the actual storage step begins, interval ST. All of the above applies to reading as well.

Figure 16:
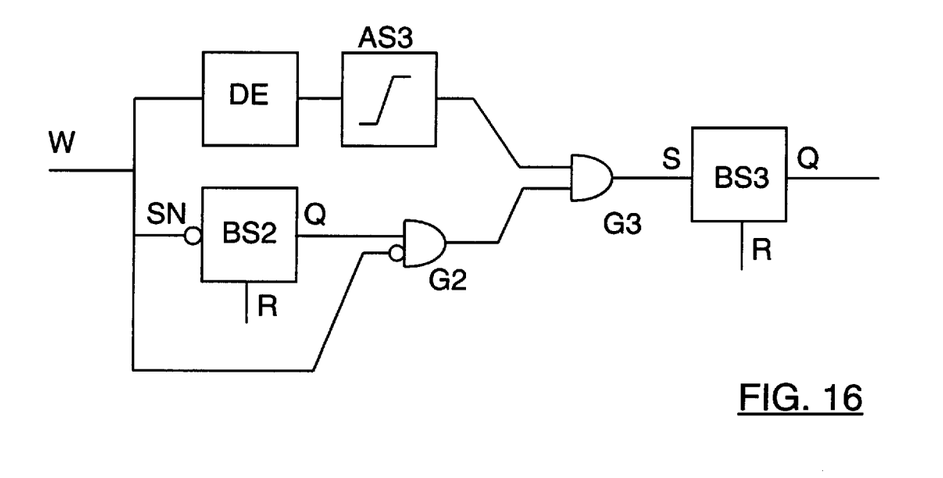

FIG. 16 shows a diagram of a second circuit capable of outputting a high active logic signal indicating the four-level write mode based on the electric signals depicted in FIGS. 6 and 7. This circuit comprises a delaying device DE having an input connected to the input W and being effective to delay an input signal to it by the aforesaid fixed predetermined time, a bistable BS2 having a set input SN of the negated type connected to the input W, a reset input R and a state output Q, a monostable AS3 responsive to leading edges and having an input connected to the output of the delaying device DE, a logic gate G2 of the AND type having a normal input connected to the output Q of the bistable BS2 and a negated input connected to the input W, a gate G3 of the AND type having two normal inputs respectively connected to the outputs of the monostable AS3 and the gate G2, a bistable BS3 having a set input S connected to the output of the gate G3, and a reset input R and a state output Q connected to the circuit output. The reset inputs R of the bistables BS2 and BS3 require to be driven for resetting at the end of each writing operation, whether a two-level or a four-level mode one.

Alternatively, this can be obtained by selecting, for different modes, different patterns for the same control and address inputs during such operations, as shown in FIGS. 4 and 5. In FIG. 4, the signals to the inputs ADR change to the address A2 from address Al within the time interval between two consecutive pulses RP1; this is recognized by the circuit MEM as the two-level read mode having been selected, and accordingly, the circuit MEM will select a fresh set of cells corresponding to the address A2, on the occurrence of the second pulse RP1. In FIG. 5, the signals to the inputs ADR do not change during the time interval between two consecutive pulses and are maintained throughout the reading operation; the circuit MEM will recognize this as the four-level read mode having been selected, and accordingly, will output a second data obtained from the cells in the corresponding set to the address A1 selected on issuance of the first pulse RP1, when the second pulse RP2 occurs.

Detecting a variation in the signals present at the address inputs is a simple operation to carry out by means of an ATD (Address Transition Detector) circuit of a well-known type to the skilled ones in the art, one embodiment thereof being shown in particular in FIG. 1 of U.S. Pat. No. 5,124,584, for example. All this applies to writing as well.

A third possibility is to select the mode in relation to selection instructions received by the memory circuit of this invention, and specifically on the unit CNT ahead of a reading or a writing operation. This can take place through all the data DT, address ADR and control E, G, W inputs. This third possibility branches off into two cases: either each reading/writing operation is preceded by the issuing of a selection instruction, which will be effectual on the next operation only, or a selection instruction is issued every now and then, and will be effectual on all the following reading/writing operations until a fresh selection instruction is issued.

Figure 2:
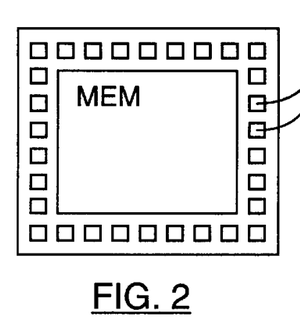
FIG. 2 is a top view of a die for device according to the invention.

For this possibility, wherein the unit CNT is able to receive, recognize and carry out instructions, a detailed description of a similar unit of CNT—referred to as a "control gate controller" and being used in a FLASH memory to provide read, write, check and erase functions—as regards its construction and operation is given in U.S. Pat. No. 5,222,046, and a block diagram thereof is shown in FIG. 2 of that document. For the purpose of this invention, the specification of U.S. Pat. No. 5,222,046, issued on Jun. 22, 1993, is incorporated herein by reference. In addition, it should be considered that in the field of FLASH memories, devices which can receive, recognize and carry out instructions, albeit for entirely different purposes, are commonly available on the market, such as devices M28F211, M28V211 and M28F221, M28V221 supplied by SGS-THOMSON MICROELECTRONICS.

Figure 17:
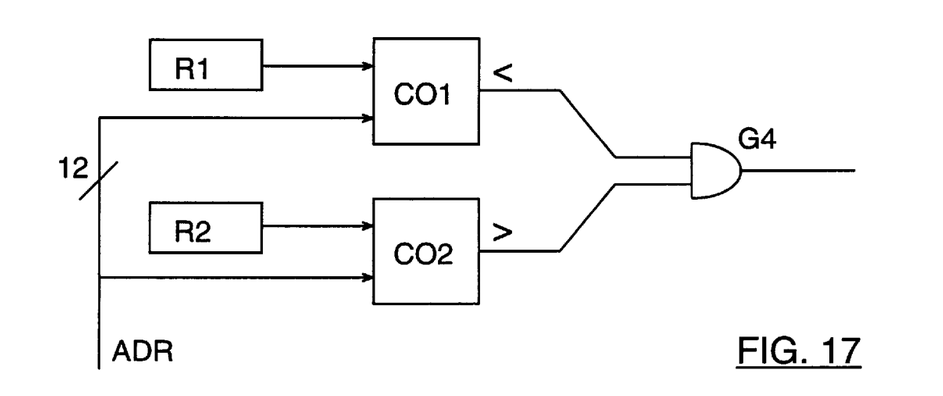

A fourth possibility, which applies to the instance where the cell plurality are divide into sets, is to select the mode in relation to the address supplied to the memory circuit of the present invention and, therefore, the unit CNT through the inputs ADR. When an element in the first set is addressed, for example, the two-level mode is enabled, whereas when an element in the second set is addressed, for example, the four-level mode is enabled. FIG. 17 shows a diagram of a fourth circuit capable of outputting a high active logic signal indicating the four-level mode in both reading and writing, based on electric address signals.

This circuit comprises a first register R1 adapted to contain a 12-bit address, a second register R2 adapted to contain a 12-bit address, a first comparator CO1 having a first input connected to the 12-bit input ADR and a second input connected to the output of the register R1 and operative to generate a high active logic signal when the address to the first input is lower than the address to the second input, a second comparator CO2 having a first input connected to the 12-bit input ADR and a second input connected to the output of the register R2 and operative to generate a high active logic signal when the address to the first input is higher than the address to the second input, and a logic gate G4 of the AND type having two normal inputs respectively connected to the outputs of the comparators CO1 and CO2 and an output connected to the circuit output.

Extremely high versatility can be provided by arranging for the unit CNT to define said first and/or second sets in relation to incoming definition instructions. Referring to FIG. 17, it will suffice that the unit CNT be adapted for loading values from the terminals DT, into the registers R1 and R2. Finally, for the sake of completeness, the unit CNT can always be embodied, by the circuitry of a suitably programmed microcontroller, regardless of the requirements set for the unit, as is well-known to the skilled ones in the art.

All of the above possibilities have a major advantage in that they are compatible with memory circuits of conventional design; in fact they will require no additional pins.

Figure 3:
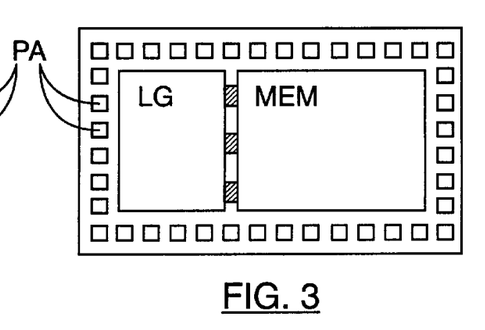
FIG. 3 is a top view of a die for another device according to the invention.

The memory circuit of this invention can be included in a semiconductor integrated electronic storage device,. as shown in FIG. 2 which highlights the die portion where the memory circuit MEM is embodied and the contact pads PA. The memory circuit according to the present invention may also be included in a generic semiconductor integrated electronic device together with at least one logic circuit connected to it for reading and/or writing information, as shown in FIG. 3. This figure highlights the die portion where the memory circuit MEM is embodied, the die portion where the logic circuit LG is embodied, and the contact pads PA. There exist several different possibilities for application of both the memory device and the generic device to boards in computers, domestic appliances, automotive electronic systems, telecommunications apparatus, etc.

I claim:

1. A memory circuit comprising:
    a plurality of memory elements, each capable of storing a multiplicity of binary information units, said plurality of memory elements having at least first and second modes of operation, the memory elements being utilized in said first mode of operation as if adapted for storing each a first number of binary information units, and being utilized in said second mode of operation as if adapted for storing each a second number of binary information units, said first and second numbers being dissimilar, said numbers chosen to have at least a two-level and multi-level mode of operation,
    at least two input/output terminals;
    a multiplexer connected to said input/output terminals; and
    a control unit connected to said multiplexer and operative to enable said modes of operation in relation to incoming selection instructions, wherein data in one mode can be obtained from data in the other mode.

2. A memory circuit according to claim 1, wherein said first number is one and said second number is two.

3. A memory circuit according to claim 1, wherein said plurality of memory elements are substantially identical, arranged into a matrix, and accessed through a common access circuit.

4. A memory circuit according to claim 1, wherein said control unit has control inputs and is operative to enable said modes of operation in relation to electric control signals to said control inputs concurrently with at least one of reading and writing operations.

5. A memory circuit according to claim 1, wherein said control unit has control inputs and is operative to enable said modes of operation in relation to electric control signals to said control inputs in advance of at least one of reading and writing operations.

6. A memory circuit according to claim 1, wherein said control unit is operative to define at least one of said first and second numbers in relation to said incoming selection instructions.

7. A memory circuit comprising:
    a plurality of memory elements divided into at least a first set and a second set, memory elements in said first set being utilized in a first mode of operation as if adapted for storing each a first number of binary information units, and memory elements in said second set being utilized in a second mode of operation as if adapted for storing each a second number of binary information units, said first and second numbers being dissimilar, said numbers chosen to have at least a two-level and multi-level mode of operation,
    at least two input/output terminals;
    a multiplexer connected to said input/output terminals; and
    a control unit connected to said multiplexer and operative to enable said modes of operation in relation to incoming selection instructions, wherein data in one mode can be obtained from data in the other mode.

8. A memory circuit according to claim 7, wherein said first number is one and said second number is two.

9. A memory circuit according to claim 7, wherein said plurality of memory elements are substantially identical, arranged into a matrix, and accessed through a common access circuit.

10. A memory circuit according to claim 7, wherein said control unit is operative to define at least one of said first and second sets in relation to incoming definition instructions.

11. A memory circuit according to claim 7, wherein said control unit is operative to enable said first mode of operation when a memory element in said first set is addressed, and to enable said second mode of operation when a memory element in said second set is addressed.

12. A memory circuit according to claim 7, wherein said control unit is operative to define at least one of said first and second numbers in relation to incoming definition instructions.

13. A semiconductor integrated electronic storage device comprising:

at least one memory circuit, said at least one memory circuit comprising a plurality of memory elements, each capable of storing a multiplicity of binary information units, said plurality of memory elements having at least first and second modes of operation, the memory elements being utilized in said first mode of operation as if adapted for storing each a first number of binary information units, and being utilized in said second mode of operation as if adapted for storing each a second number of binary information units, said first and second numbers being dissimilar, said numbers chosen to have at least a two-level and multi-level mode of operation, at least two input/output terminals;

a multiplexer connected to said input/output terminals; and a control unit connected to said multiplexer and operative to enable said modes of operation in relation to incoming selection instructions, wherein data in one mode can be obtained from data in the other mode.

14. A device according to claim 13, further comprising a logic circuit connected to said at least one memory circuit for at least one of reading information therefrom and writing information thereto.

15. A device according to claim 13, wherein said first number is one and said second number is two.

16. A device according to claim 13, wherein said plurality of memory elements are substantially identical, arranged into a matrix, and accessed through a common access circuit.

17. A device according to claim 13, wherein said control unit has control inputs and is operative to enable said modes of operation in relation to electric control signals to said control inputs concurrently with at least one of reading and writing operations.

18. A device according to claim 13, wherein said control unit has control inputs and is operative to enable said modes of operation in relation to electric control signals to said control inputs in advance of at least one of reading and writing operations.

19. A device according to claim 13, wherein said control unit is operative to define at least one of said first and second numbers in relation to incoming definition instructions.

\* \* \* \* \*

UNITED STATES PATENT AND TRADEMARK OFFICE
CERTIFICATE OF CORRECTION

PATENT NO. : 5,859,795
DATED : January 12, 1999
INVENTOR(S) : ROLANDI

It is certified that error appears in the above-identified patent and that said Letters Patent is hereby corrected as shown below:

Column 4, Line 13    Strike: "he"

Insert: -- the --

Column 6, Line 26    Strike: "da a"

Insert: -- data --

Column 10, Line 12   Strike: "I claim:"

Insert: -- CLAIMS: --

Signed and Sealed this

Eighteenth Day of May, 1999

Attest:

Q. TODD DICKINSON

*Attesting Officer*        *Acting Commissioner of Patents and Trademarks*